US006396312B1

(12) United States Patent
Shepston et al.

(10) Patent No.: US 6,396,312 B1
(45) Date of Patent: May 28, 2002

(54) GATE TRANSITION COUNTER

(75) Inventors: Shad R. Shepston, Firestone; Jeff Rearick; John G Rohrbaugh, both of Ft Collins, all of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/637,534

(22) Filed: Aug. 11, 2000

(51) Int. Cl.$^7$ .................................... H03B 21/00

(52) U.S. Cl. ........................ 327/105; 331/45; 331/57

(58) Field of Search ..................... 327/105; 331/45, 331/57

(56) References Cited

U.S. PATENT DOCUMENTS 5,126,691 A * 6/1992 Mijuskovie et al. ........ 331/1 A
5,528,200 A * 6/1996 Yamauchi et al. ............ 331/45
5,534,809 A * 7/1996 Watanabe et al. ........... 327/269
5,684,760 A * 11/1997 Hunter ....................... 368/120

* cited by examiner

*Primary Examiner*—Terry D. Cunningham
*Assistant Examiner*—Quan Tra

(57) ABSTRACT

A gate transition counter. A ring oscillator provides a plurality outputs, each delayed from the adjacent output by a gate delay. The outputs of the ring oscillator are captured by an array of latches upon receipt of a halt signal. The last latch drives a ripple counter. The preferred implementation uses five inverters in the ring oscillator so that each complete cycle of the ring oscillator represents ten gate delays. A ripple counter counts the number of gate delays by ten. The latch outputs and the ripple counter outputs can be converted to a binary representation of the number of gate delays to provide a count with the smallest time increment that can be produced by the circuit.

33 Claims, 5 Drawing Sheets

500

GATE TRANSITION COUNTER

CROSS REFERENCE TO RELATED DOCUMENTS

This application is related to U.S. patent application Ser. No. 09/637,535 for a "Programmable Divider", to Shad Shepston et al. filed simultaneously herewith, which is hereby incorporated by reference.

FIELD OF THE INVENTION

This invention relates generally to the field of timing circuits. More particularly, this invention relates to an apparatus and method for use of a ring counter to count gate transitions.

BACKGROUND OF THE INVENTION

In many circuit applications, it is common to measure time in discrete time segments that might be unrelated to conventional time measurements (e.g. seconds or microseconds). A simple example is the number of clock transitions that a microprocessor requires to complete a given task (for example, an add or divide operation). In another example, if a circuit operates using a conventional clock circuit having a clock period of T, it might be necessary to establish a logic transition to occur at approximately 1/16 of the time period T after the clock transition. Latches and/or registers configured as a counter might be conventionally used to establish such transition times by accumulating the time delay associated with several latches or registers to produce the desired time delay. Since such latches and registers have delays caused by multiple gate transitions, they can have relatively long delays associated with them. In many applications, particularly at higher frequencies, the time delay associated with toggling a latch or register is not a small enough time increment to provide adequate resolution to achieve a desired timing accuracy. Consider a 1.8 micron CMOS circuit example wherein a clock period T is 2.0 nanoseconds, a gate delay is 30 picoseconds and a latch requires six gate delays or 180 picoseconds. In this example, T/16=125 picoseconds. Thus, in this example, one latch delay is far too large to approximate the required 1/16 of a clock period for most applications. In general, for this application, the desired time can only be guaranteed within about three gate delays (half of the six gate delays of the latch).

Moreover, integrated circuit processing variations can change the absolute time associated with a given latch and register by significant amounts. This compounds the problem of using a latch or register in some circumstances, since the error in resolution can be exaggerated by processing variations. Considering the above example, if the clock period is fixed (e.g. by a crystal controlled oscillator), a processing variation resulting in only a 10% increase in gate delay time would result in a latch delay of 198 picoseconds—even further from the required T/16=125 picoseconds.

Therefore, it would be advantageous to use the smallest time measurement increment available to minimize such errors. In the case of integrated circuit design, the smallest delay time is generally a single gate transition. However, due to significant variations in processing parameters, the absolute number of gate transitions also cannot be reliably known. In the above example, four gate transitions equals 120 picoseconds, which approximates the required 125 picoseconds good enough for many applications. However, those skilled in the art will appreciate that one gate transition time for this process might range from about 20 picoseconds to 50 picoseconds. This means that the exact number of gate transitions required to approximate 125 picoseconds could be anywhere from two to six gate transitions.

BRIEF SUMMARY OF THE INVENTION

The present invention relates generally to a gate transition counter circuit and methods therefor. Objects, advantages and features of the invention will become apparent to those skilled in the art upon consideration of the following detailed description of the invention.

In one embodiment of the present invention, a circuit consistent with the present invention that counts gate transitions includes a ring oscillator having a plurality of N inverting circuits, where N is an odd integer, each inverting circuit having an input and an output. The inverting circuits are connected together, input to output, to form a continuous loop. The circuit includes an input for receiving a halt control signal to halt the oscillation of the ring oscillator. The circuit also includes a plurality of N latches, each latch having an input and an output, with each of the N latch inputs connected to one of the N inverter circuit outputs. The halt control signal is coupled to the plurality of N latches to capture the output of the N inverting circuits when the halt control signal is received.

In another embodiment, a circuit consistent with the present invention that counts gate transitions includes a ring oscillator having a plurality of N inverting circuits, where N is an odd integer. Each inverting circuit has an input and an output. The inverting circuits are connected together input to output to form a continuous loop. The ring oscillator includes a circuit for receiving a start control signal to start the oscillation of the ring oscillator and a circuit for receiving a halt control signal to halt the oscillation of the ring oscillator. A plurality of N buffers is provided, and a plurality of N latches, each having an input and an output, has each of the N latch inputs connected to one of the N inverter circuit outputs through one of the N buffers. The halt control signal is coupled to the plurality of N latches to capture the output of the N inverting circuits when the halt control signal is received. A ripple counter has an input coupled to one of the latch outputs. The ripple counter counts a number of transitions of the latch output and produces a ripple counter output. A logic circuit receives the N latch outputs and converts the N latch outputs to a binary value.

A method, consistent with certain embodiments of the present invention, of capturing the state of a ring oscillator, wherein the ring oscillator includes a plurality of N inverting circuits, where N is an odd integer, each inverting circuit having an input and an output, the inverting circuits being connected together input to output to form a continuous loop, includes: causing the ring oscillator to oscillate; receiving a halt control signal to halt the oscillation of the ring oscillator; and latching a value at each output in one of a plurality of N latches to create a latched value R.

In another method consistent with the present invention, of capturing the state of a ring oscillator, the ring oscillator comprising a plurality of N logic gates, each gate having an input and an output, the gates being connected together input to output to form a continuous loop, the method includes: causing the ring oscillator to oscillate; receiving a halt control signal to halt the oscillation of the ring oscillator; and latching a value at each output in one of a plurality of N latches to create a latched value R.

Many variations, equivalents and permutations of the above illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
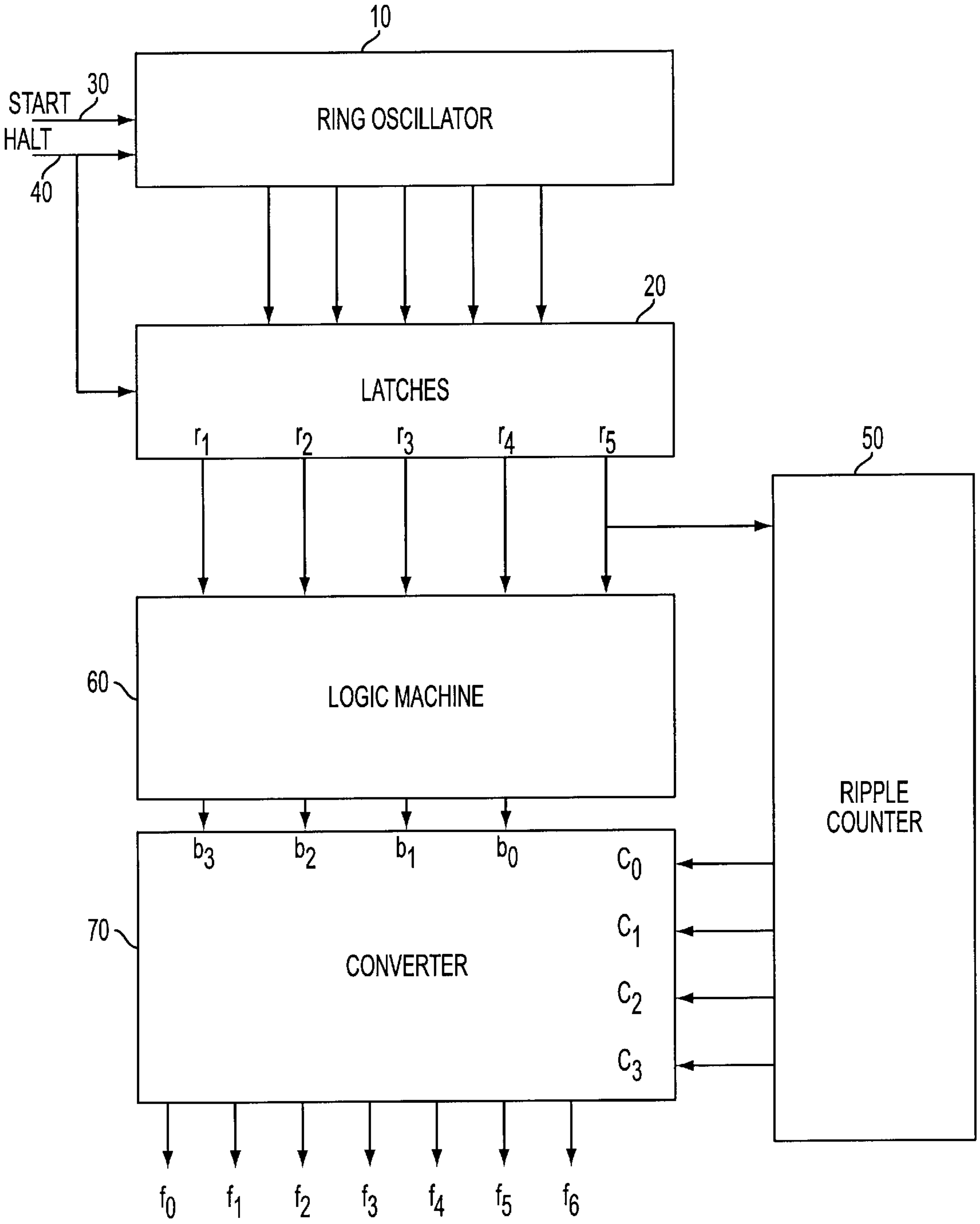
FIG. 1 is a block diagram of a gate transition counter in accordance with one embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, the present invention utilizes a ring oscillator 10 with outputs captured at the output of each inverter in the ring as a mechanism for measuring the time lapsed in a single gate transition for the present invention. The output of each inverter in the ring oscillator 10 is coupled to a plurality of latches 20. The ring oscillator 10 begins oscillating upon receipt of a start signal 30 and ceases oscillating upon receipt of a halt signal 40. Upon receipt of the halt signal 40, the value at the output of each inverter in the ring oscillator 10 is captured by the array of latches 20 to produce a value R. In the example illustrated, five inverters are used and thus five binary values $r_1$ through $r_5$ are latched into latches 20 upon receipt of halt signal 40. The output of the last inverter in the ring oscillator 10 is captured as $r_5$. This value of $r_5$ is used to provide an input to a ripple counter 50 that is used to count the number of complete cycles of the ring oscillator 10.

Ripple counter 50, as shown, provides four stages of count with output values $C_0$ through $C_3$, with $c_3$ being the most significant bit of the four bit count. The binary output of the ripple counter C thus provides a count of the number of complete cycles of ring oscillator 10. Ring oscillator 10, by virtue of having 5 stages, can produce a total of 10 gate transitions (one up and one down for each gate) in one complete cycle of the oscillator. That is, each inverter in the ring oscillator will pass through one positive going transition and one negative going transition for each cycle of the ring oscillator 10. Thus, ripple counter 50 counts the number of tens of gate transitions in binary.

The output R of latches 20 can be manipulated by a logic machine 60 to produce a binary value B having values $b_0$ through $b_3$, with $b_0$ being the least significant bit. The B values and C values from logic machine 60 and ripple counter 50 respectively can be combined together in a converter 70 to produce an output F, having bits $f_0$ through $f_6$, in the current example, which represents the number of gate transitions of ring oscillator 10 in binary. Those skilled in the art will understand that ripple counter 50 can be extended by as many stages as needed to produce a binary count large enough for the task at hand.

Figure 2:
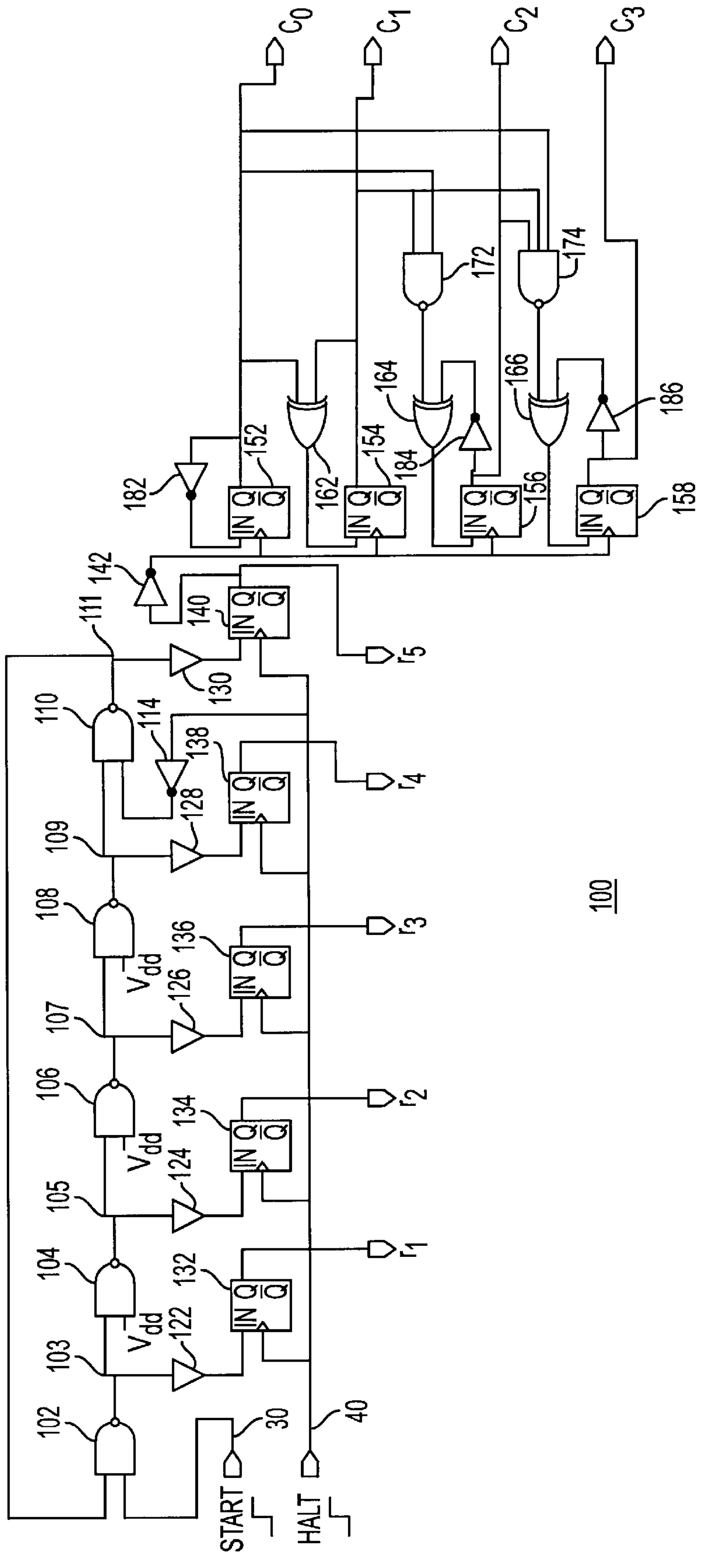
FIG. 2 is a schematic diagram of the ring oscillator, latches and ripple counter of FIG. 1 for an embodiment of the present invention.

Referring now to FIG. 2, a more detailed illustration of ring oscillator 10, latches 20 and ripple counter 50 are shown as circuit 100. Circuit 100 provides the basic counting function to count the gate transitions of each of the inverters in ring oscillator 10. In the embodiment of circuit 100, the inverting functions required for ring oscillator 10 are provided by five NAND gates 102, 104, 106, 108 and 110 (In general, any odd integer number N of inverting circuits can be used. If non-inverting gates are used in the ring, oscillation may occur with N being an even number.). NAND gates 104, 106 and 108, by virtue of having an input connected to a logic one ($V_{dd}$) behave as simple inverters. NAND gate 102 also behaves as a simple inverter upon receipt of a logic one start signal 30 at its second input. In a similar manner, halt signal 40 is provided through an inverter 114 so that a low going signal at the second input of NAND gate 110 stops the migration of the signal through the ring at NAND gate 110, and thus causes the ring oscillator to stop oscillating.

Those skilled in the art will recognize that the circuit diagram of FIG. 2 is a simplification used to illustrate the concept of the present invention. Various circuit adjustments to facilitate appropriate timing of the circuit may be required to accurately capture the number of gate transitions. For example, the gate delay of the halt signal passing through inverter 114 should be taken into consideration in order to assure that an accurate count from the ring oscillator is achieved.

Ignoring the second input of the NAND gates 102, 104, 106, 108 and 110, one is left with a series connected ring of inverters with each inverter input connected to the output of the proceeding inverter. Each input/output junction is labeled 103, 105, 107, 109 and 111 respectively. The signal at each of these junctions 103, 105, 107, 109 and 111 is provided to a buffer 122, 124, 126, 128 and 130 respectively. These buffers are used to drive the inputs of a set of five (in general N) latches 132, 134, 136, 138 and 140 respectively. Again, those skilled in the art will recognize that any timing associated with the buffers 122, 124, 126, 128 and 130 should be accounted for in assuring that the proper number of gate transitions is properly captured. Latches 132, 134, 136, 138 and 140 each receive the halt signal 40, which is used to cease oscillation of the ring oscillator 10. Upon receipt of the halt signal 40, the latches 20 latch in the values present at nodes 103, 105, 107, 109 and 111 to produce values $r_1$, $r_2$, $r_3$, $r_4$ and $r_5$ respectively.

The output of the last latch 140 ($r_5$) is inverted by an inverter 142 and is used as the clock signal for the four latches used in ripple counter 50. These four latches are shown as 152, 154, 156 and 158 respectively. The ripple counter 50 can be of any suitable design and produces binary outputs $c_0$, $c_1$, $c_2$ and $c_3$ representing the number of tens of gate transitions occurring in ring oscillator 10. In other words, the output $r_5$ is used as a type of overflow indicator with ripple counter 50 counting the number of overflows occurring in the count captured by latches 20 of ring oscillator 10. The values $c_0$ through $c_3$ are fed back and combined through EXCLUSIVE OR (EXOR) gates 162, 164 and 166 as well as NAND gates 172 and 174 along with inverters 182, 184 and 186 in a known manner to provide the binary count C. Any other suitable ripple counter design could also be adapted for use without departing from the present invention.

Thus, in operation a start signal 30 is applied at the input of gate 102 to begin oscillation of the ring oscillator 10. Upon receipt of a subsequent halt signal 40, the ring oscillator ceases to oscillate and its' halted state is captured in latches 20 with each cycle of the ring oscillator appearing as a count in ripple counter 50. The output values $r_1$ through $r_5$ (i.e., R) and $c_0$ through $c_3$ (i.e., C) can thus be used to represent the number of gate transitions that have occurred between the time of the start signal and the time of the halt signal. It should be noted, however, that the values of C are in the form of a binary number, while the values of R are not. In order to effectively use the count, many embodiments may require conversion of the count C+R to a binary (or decimal or other) representation. In other embodiments, these values R and C may be used directly.

Figure 3:
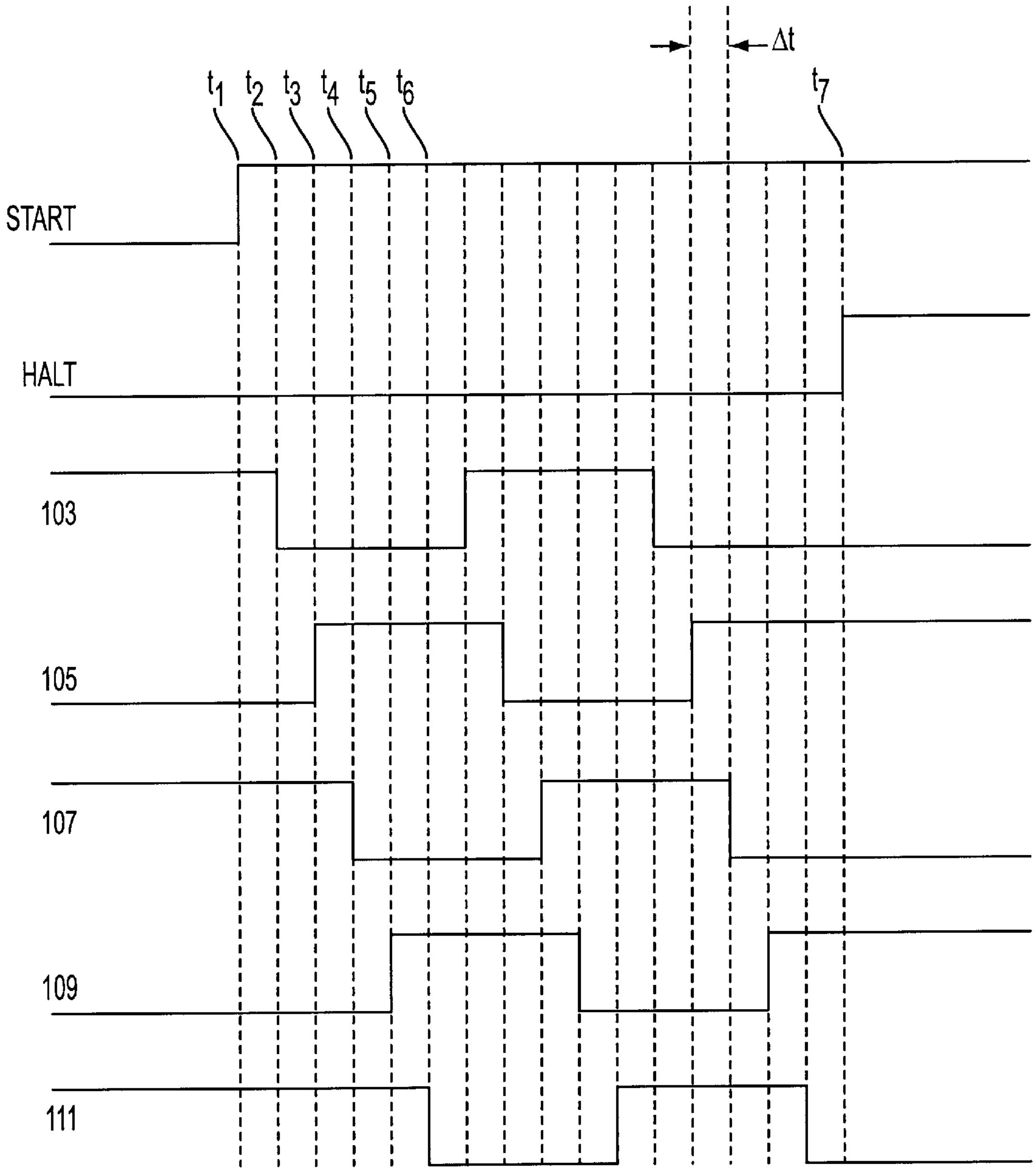
FIG. 3 is a timing diagram illustrating the interaction of the start signal and halt signal with the ring counter of FIG. 1.

The operation of the combination of the ring counter 10 and latches 20 is illustrated in the timing diagram of FIG. 3 which shows the values of nodes 103, 105, 107, 109 and 111 (or alternately, $r_1$, $r_2$, $r_3$, $r_4$ and $r_5$), with time increasing from left to right. At time $t_1$, the start signal is applied to NAND gate 102 and the logic value appearing at node 103 makes a positive-to-negative transition at time $t_2$. The amount of time between any two adjacent vertical time lines is given by $\epsilon t$, which represents one gate transition time. At time $t_3$, one gate transition time after $t_2$, the output at node 105 makes a low-to-high transition. Similarly, one gate delay later at time $t_4$, node 107 makes a high-to-low transition. One-gate delay later at time $t_5$ node 109 makes a low-to-high transition and at time $t_6$ node 111 makes a high-to-low transition. At this point in time, each of the inverters in ring oscillator 10 has been triggered and is involved in oscillating. Node 111 provides a new input signal to gate 102 to produce its next transition and so on.

The oscillations continue until time $t_7$ at which point the halt signal makes a low-to-high transition. This signal is inverted and applied to AND gate 110, so that this transition ceases the oscillation of ring oscillator 10. In addition, the halt signal latches the values of $r_1$ through $r_5$ from the nodes 103, 105, 107, 109 and 111 into latches 132, 134, 136, 138 and 140 to the values present at the time of the halt signal. As illustrated in FIG. 3, the signal at node 111 passes through more than one complete cycle causing the ripple counter 50 to count. In this simple example, only a count of one is registered in the ripple counter. However, if the halt signal was received at a later time, the ripple counter would count every complete cycle of the signal at node 111 which would then appear as a binary count C.

Once the values of r are captured by latches 20, logic machine 60 converts the values of r to binary using the equations:

$$b_3=\bar{r}_3\cdot r_5$$

$$b_2=r_3\cdot r_4$$

$$b_1=r_1\cdot\bar{r}_4+r_1\cdot\bar{r}_3$$

$$b_0=r_1\cdot\bar{r}_2+r_3\cdot\bar{r}_4+r_1\cdot r_2\cdot r_3\cdot r_4\cdot r_5+\bar{r}_2\cdot r_3+\bar{r}_4\cdot r_5$$

Figure 4:
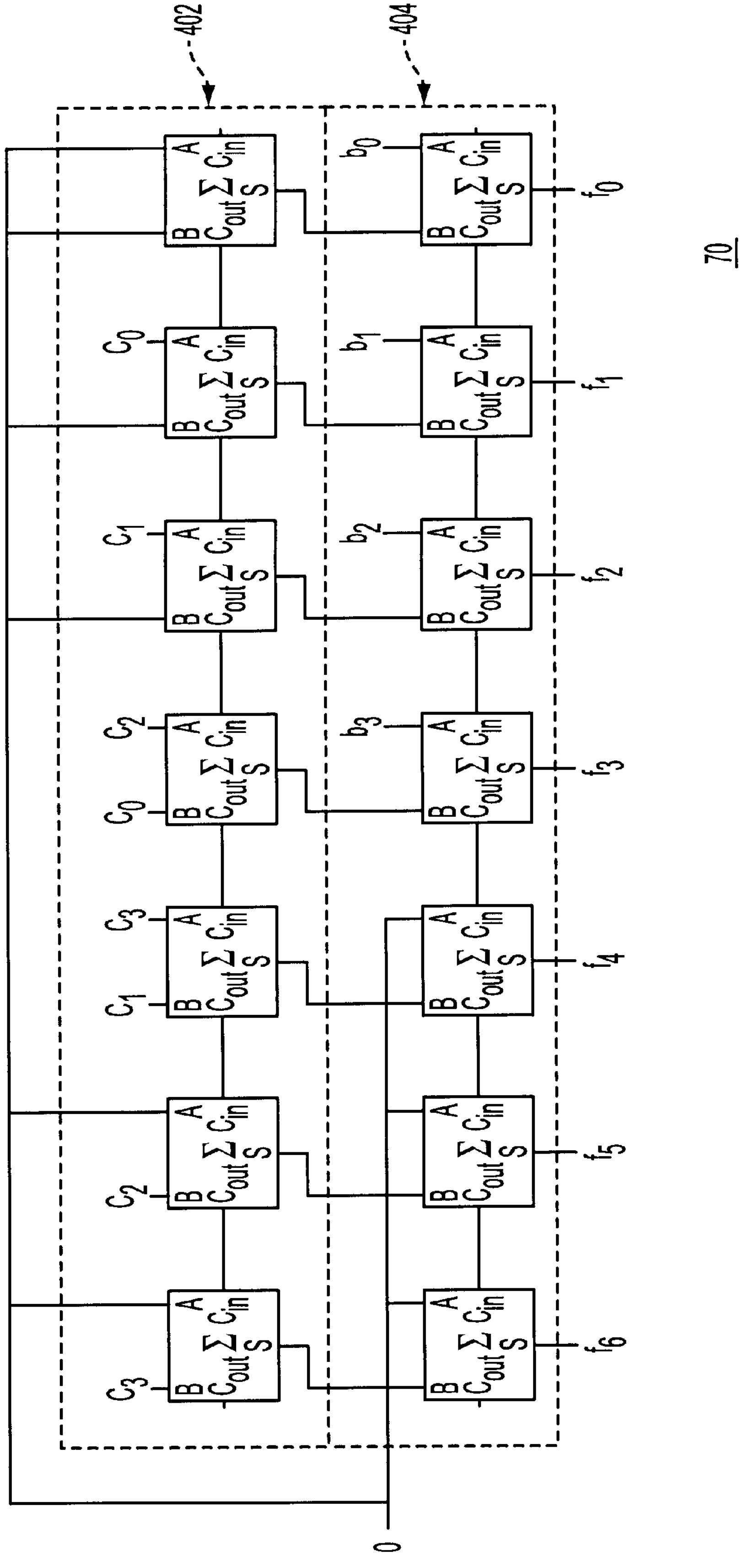
FIG. 4 is a circuit realization of converter 70 of FIG. 1.

Logic machine 60 is fully defined by these equations for the present embodiment, and can easily be derived for alternative embodiments having fewer or more bits. Thus, the five individual bit values of R representing the state of the ring oscillator 10 at the time of the halt signal are converted to a 4 bit binary representation shown as $b_0$ through $b_3$ above. In order to convert the count from logic machine 60 (B) and the count from ripple counter 50 (C) to a single binary count, the values of C and B are combined by converter 70. This is accomplished, for example, using the circuit shown in FIG. 4 in which the F values are given as F=(10×C)+B , where "10" is a decimal ten (not a binary 10). This can be broken down into F=(2C+8C)+B. In order to implement this, the circuit 70 of FIG. 4 shifts the value of C to the left by one bit to accomplish a multiplication by two. In addition, the value of C is shifted to the left by three bits to accomplish a multiplication by eight. These two values are added together by a row of seven one bit full adders 402 the output of which is added to the values of B using a second row of seven one bit full adders 404. The resulting output is the binary representation F for the number of gate transitions occurring in ring oscillator 10.

In the circuit described thus far, a circuit arrangement has been shown which can be utilized to time the amount of time between a start signal 30 and a halt signal 40. The time is represented as F, which in this example, is a seven bit binary number representing the number of gate delays encountered in ring oscillator 10. This arrangement can be used to determine, for example, how many gate delays are equivalent to a clock period which is used to trigger start signal 30 at the beginning of the clock period and halt signal 40 at the end of the clock period. Thus, for a clock period T of 2.0 nanoseconds and a gate delay of 30 picoseconds, approximately 66 gate transitions in ring oscillator 10 are encountered. In this example, the smallest measurable time unit (one gate delay) is 30 picoseconds. If 1/16 of a clock period T is required (125 nanoseconds) can be approximated by four 30 picosecond gate delays (120 nanoseconds).

Given the same requirement for 1/16 of a clock period T with a gate delay of 20 picoseconds, the required delay time can be approximated by six gate delays of 20 picoseconds. The appropriate number of gate delays can thus be configured using any method desired upon making a determination of the proper number of gate transitions required. In any case, the required time can be generated to within one half gate delay, in contrast to the three gate delays of the previous example.

In one embodiment, the time can be determined from the output of ripple counter 50 and latches 20 directly. This can be accomplished by presetting the ripple counter 50 and ring oscillator 10. In this embodiment, when the ripple counter 50 overflows, the appropriate count has been reached. Presetting the ripple counter 50 can be accomplished by known presetting techniques. The ring oscillator's preset can be accomplished by changing the location of the start signal used to drive the ripple counter and/or changing which of the five NAND gates receives the halt signal at the second input thereof. In this manner, the first count of the ring counter 10 will have less than the full ten gate transitions.

Figure 5:
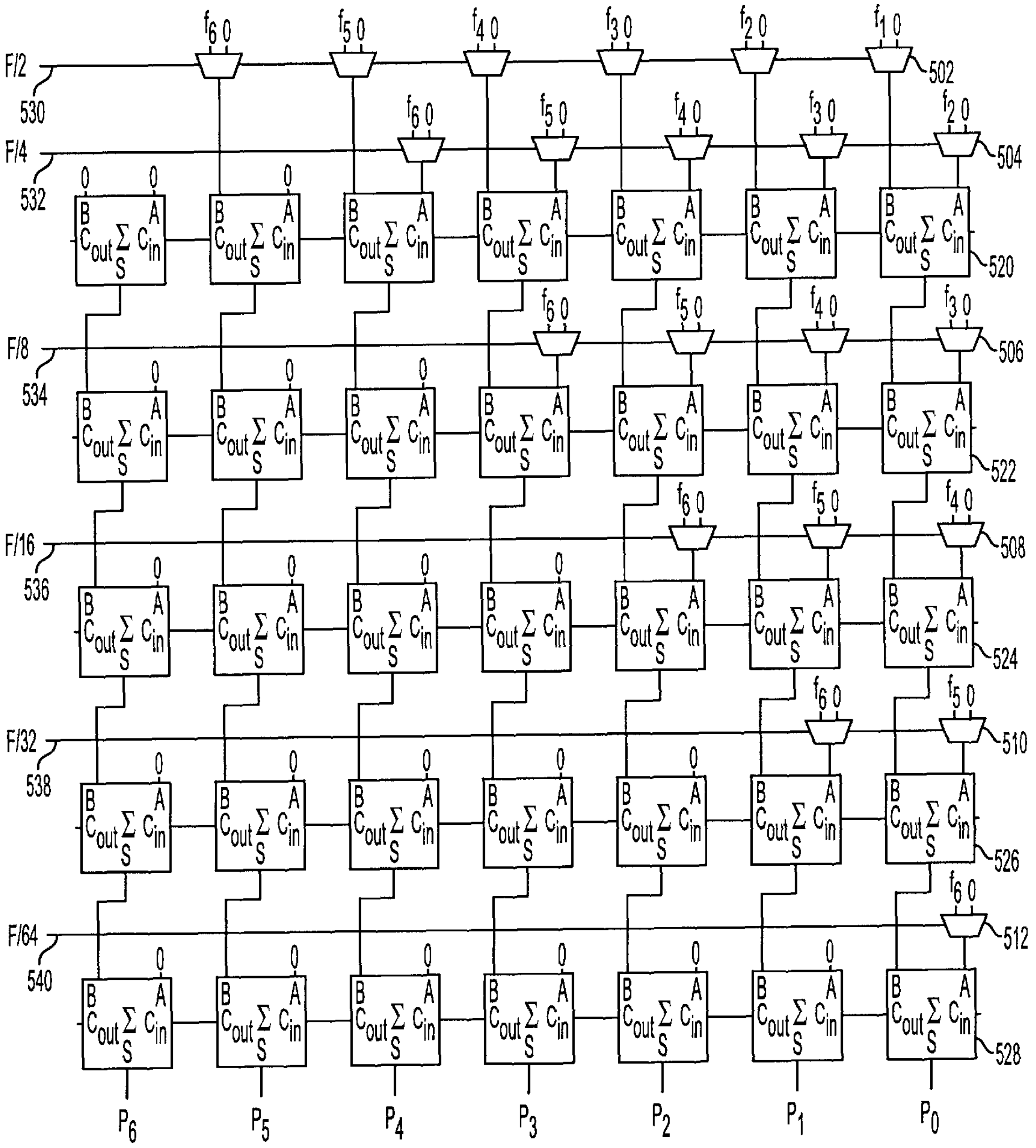
FIG. 5 is an embodiment of a programmable divider that can be used to selectively divide the value of F of FIG. 1 in an embodiment of the invention.

The values of F can also be used directly to compute a fractional value P of the time interval between the start and signal 30 and the halt signal 40. Circuit 500 of FIG. 5 can thus be used to select any fractional value to the resolution of the binary count of F. The circuit of FIG. 5 includes six rows of multiplexers 502, 504, 506, 508, 510 and 512. These multiplexers are used to provide bit shifted versions of F to five rows of adders 520, 522, 524, 526 and 528. From top to bottom the output of each adder forms an input for the next adder with the next multiplexer array providing the second input for the adders. The first row of multiplexers 502 selectively provides either an array of zeros or the value of F shifted to the right by one bit as the B inputs to adders 520. By shifting the value of F to the right by one bit, the value of F/2 is added in by appropriately selecting line 530.

Line 532 controls the array of multiplexers 504 to selectively add in F shifted to the right by two bits or F/4. Thus, by selection of line 532, the value 0 or F shifted to the right by two is provided as the a inputs to adders 520 with zeros backfilling the most significant bits of F. In a similar manner, the value of F is shifted by one additional bit for each row of multiplexers 506 controlled by line 534, 508 controlled by line 536, 510 controlled by line 538 and 512 controlled by line 540. Thus, by selection of line 534, F/8 is added. Selection of line 536 adds F/16 while selection of 538 and 540 add F/32 and F/64 respectively. By combining lines 530, 532, 534, 536, 538 and 540 in any combination, any value from 1/64 to 63/64 can be selected as the fraction provided by circuit 500. In the general case, the programmable divider circuit receives the binary count F and produces an output value P representing the binary count F divided by a programmed value equal to $(2^{M-1})/K$, where K is an integer between 1 and $(2^{M-1}-1)$ and where M is the number of bits of the binary count F.

This divided value P can be subtracted from the overflow value and used to preset in accordance with certain embodiments of the present invention. The divider 500 is described in greater detail in U.S. patent application Ser. No. 09/637,535, to Shad Shepston et al., entitled "Programmable Divider", which is hereby incorporated by reference.

While the above disclosure presumes that the oscillation begins at a start signal, this should not be limiting since the oscillation could also begin with the application of power to the circuit. The exact implementation should account for any delays in the circuit implementation (e.g. generation of the start and halt signals, buffering delays, etc.) to assure an accurate count of gate transitions. While the above example uses a four bit ripple counter, a ripple counter of any size could be used. Similarly, the number N of inverting circuits used in the ring oscillator can be varied without departing from the invention. Moreover, any suitable means can be used for presetting the latches in the event the device is used to count a predetermined count. An arithmetic logic unit or other divider could be used to substitute for divider 500. In addition, the present invention applies a signal to one input of an NAND gate in the ring oscillator to achieve the Halt and Start of the oscillator, but other techniques can be used. For example, but not by way of limitation, other logic gates such as INVERTER, OR, NOR, AND, EXOR gates, etc. and combinations thereof can be used to implement an analogous ring oscillator with input control to these gates (including opening of a series switch to open the ring or controlling the input of a gate) could be used to Start and Halt the oscillation without departing from the invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A circuit that counts gate transitions, comprising:

a ring oscillator comprising a plurality of N inverting circuits where N is an odd integer, each inverting circuit having an input and an output, the inverting circuits being connected together input to output to form a continuous loop;

means for receiving a halt control signal to halt the oscillation of the ring oscillator;

a plurality of N latches, each having an input and an output, with each of the N latch inputs connected to one of the N inverter circuit outputs; and wherein, the halt control signal is coupled to the plurality of N latches to capture the output of the N inverting circuits when the halt control signal is received.

2. The circuit of claim 1, wherein at least one of the N inverting circuits comprises a NAND gate having first and second inputs, with the first input connected to a preceding inverting circuit; and wherein the means for receiving the halt control signal comprises the second input.

3. The circuit of claim 1, wherein the plurality of N inverting circuits includes a first inverting circuit and a last inverting circuit; and wherein the last inverting circuit comprises a NAND gate having two inputs, with a first of said two inputs comprising the last inverting circuit's input and a second of said two inputs receiving the halt control signal.

4. The circuit of claim 1, further comprising a plurality of N buffers disposed between the N inverting circuits and the N latches.

5. The circuit of claim 1, further comprising:

means for receiving a start control signal to start the oscillation of the ring oscillator.

6. The circuit of claim 5, wherein at least one of the N inverting circuits comprises a NAND gate having first and second inputs, with the first input connected to a preceding inverting circuit; and wherein the means for receiving the start control signal comprises the second input.

7. The circuit of claim 5, wherein the plurality of N inverting circuits includes a first inverting circuit and a last inverting circuit; and wherein the first inverting circuit comprises a NAND gate having two inputs, with a first of said two inputs comprising the first inverting circuit's input and a second of said two inputs receiving the start control signal.

8. The circuit of claim 5, wherein the plurality of N inverting circuits includes a first and a last inverting circuit:

and wherein the plurality of N latches includes a corresponding first and last latch with the first latch input receiving the first inverting circuit output, and with the last latch input receiving the last inverting circuit output;

and further comprising, a ripple counter having an input coupled to the last inverting circuit output, the ripple counter counting a number of transitions of the last inverting circuit and producing a ripple counter output.

9. The circuit of claim 8, wherein the ripple counter input is coupled to the last inverting circuit through the last latch.

10. The circuit of claim 9, further comprising:

a logic circuit receiving the N latch outputs and converting the N latch outputs to a binary value.

11. The circuit of claim 10, wherein N=5 and wherein the five latch outputs are designated $r_1$, $r_2$, $r_3$, $r_4$ and $r_5$, and wherein the logic circuit converts the five latch outputs to a binary value B having bits $b_0$, $b_1$, $b_2$ and $b_3$ from least significant to most significant bits by the equations:

$$b_3=\bar{r}_3 \cdot r_5$$

$$b_2=r_3 \cdot r_4$$

$$b_1=r_1\cdot\bar{r}_4+r_1\cdot\bar{r}_3$$

$$b_0=r_1\cdot\bar{r}_2+r_3\cdot\bar{r}_4+r_1\cdot r_2\cdot r_3\cdot r_4 r_5+\bar{r}_2 r_3+\bar{r}_4\cdot r_5.$$

12. The circuit of claim 11, wherein the ripple counter output is a four bit binary count designated C having bits $c_0$, $c_1$, $c_2$ and $c_3$ from least significant bit to most significant bit; and further comprising a converting circuit for combining C with B to produce a seven bit binary value F having bits $f_0$, $f_1$, $f_2$, $f_3$, $f_4$, $f_5$ and $f_6$ from least significant bit to most significant bit, where F=B+10C.

13. The circuit of claim 10, further comprising:

a second converting circuit receiving the binary count from the logic circuit and the output of the ripple counter, and producing binary count F representing a number of transitions of the inverting circuit.

14. The circuit of claim 13, further comprising:

a programmable divider circuit receiving the binary count F and producing an output value representing the binary count divided by a programmed value equal to $(2^{M-1})/K$, where K is an integer between 1 and $(2^{M-1}-1)$.

15. The circuit of claim 14, wherein the ripple counter further comprises a preset input which presets an initial value of the ripple counter, the preset input receiving the output value of the programmable divider circuit.

16. A circuit that counts gate transitions, comprising:

a ring oscillator comprising a plurality of N inverting circuits where N is an odd integer, each inverting circuit having an input and an output, the inverting circuits being connected together input to output to form a continuous loop;

means for receiving a start control signal to start the oscillation of the ring oscillator;

means for receiving a halt control signal to halt the oscillation of the ring oscillator;

a plurality of N buffers;

a plurality of N latches, each having an input and an output, with each of the N latch inputs connected to one of the N inverter circuit outputs through one of the N buffers;

wherein, the halt control signal is coupled to the plurality of N latches to capture the output of the N inverting circuits when the halt control signal is received;

a ripple counter having an input coupled to one of said latch outputs, the ripple counter counting a number of transitions of said latch output and producing a ripple counter output; and a logic circuit receiving the N latch outputs and converting the N latch outputs to a binary value.

17. The circuit of claim 16 wherein at least one of the N inverting circuits comprises a NAND gate having first and second inputs, with the first input connected to a preceding inverting circuit; and wherein the means for receiving the halt control signal comprises the second input.

18. The circuit of claim 16, wherein the plurality of N inverting circuits includes a first inverting circuit and a last inverting circuit; and wherein the last inverting circuit comprises a NAND gate having two inputs, with a first of said two inputs comprising the last inverting circuit's input and a second of said two inputs receiving the halt control signal.

19. The circuit of claim 16, wherein at least one of the N inverting circuits comprises a NAND gate having first and second inputs, with the first input connected to a preceding inverting circuit; and wherein the means for receiving the start control signal comprises the second input.

20. The circuit of claim 16, wherein the plurality of N inverting circuits includes a first inverting circuit and a last inverting circuit; and wherein the first inverting circuit comprises a NAND gate having two inputs, with a first of said two inputs comprising the first inverting circuit's input and a second of said two inputs receiving the start control signal.

21. The circuit of claim 16, wherein the N latch outputs are designated $r_1$, $r_2$, $r_3$, $r_4$ and $r_5$, and wherein the logic circuit converts the N latch outputs to a binary value B having bits $b_0$, $b_1$, $b_2$ and $b_3$ from least significant to most significant bits by the equations:

$$b_3=\bar{r}_3\cdot r_5$$

$$b_2=r_3\cdot r_4$$

$$b_1=r_1\cdot\bar{r}_4+r_1\cdot\bar{r}_3$$

$$b_0=r_1\cdot\bar{r}_2+r_3\cdot\bar{r}_4+r_1\cdot r_2\cdot r_3\cdot r_4 r_5+\bar{r}_2 r_3+\bar{r}_4\cdot r_5.$$

22. The circuit of claim 21, wherein the ripple counter output is a four bit binary count designated C having bits $c_0$, $c_1$, $c_2$ and $c_3$ from least significant bit to most significant bit; and further comprising a converting circuit for combining C with B to produce a seven bit binary value F having bits $f_0$, $f_1$, $f_2$, $f_3$, $f_4$, $f_5$ and $f_6$ from least significant bit to most significant bit, where F=B+10C.

23. The circuit of claim 22, further comprising:

a second converting circuit receiving the binary count from the first converting circuit and the output of the ripple counter, and producing binary count F representing a number of transitions of the inverting circuit.

24. The circuit of claim 23, further comprising:

a programmable divider circuit receiving the binary count F and producing an output value representing the binary count divided by a programmed value equal to $(2^{M-1})/K$ , where K is an integer between 1 and $(2^{M-1}-1)$.

25. The circuit of claim 24, wherein the ripple counter further comprises a preset input which presets an initial value of the ripple counter, the preset input receiving the output value of the programmable divider circuit.

26. A method of capturing the state of a ring oscillator, the ring oscillator comprising a plurality of N inverting circuits where N is an odd integer, each inverting circuit having an input and an output, the inverting circuits being connected together input to output to form a continuous loop, comprising:

causing the ring oscillator to oscillate;

receiving a halt control signal to halt the oscillation of the ring oscillator;

latching a value at each output in one of a plurality of N latches to create a latched value R;

converting the latched value of R to a binary number;

counting a number of complete cycles of the ring oscillator to produce a count C; and combining the values of C and R to duce a number of gate transitions.

27. The method of claim 26, wherein the counting is carried out in a ripple counter circuit.

28. A method of capturing the state of a ring oscillator, the ring oscillator comprising a plurality of N inverting circuits where N is an odd integer, each inverting circuit having an input and an output, the inverting circuits being connected together input to output to form a continuous loop, comprising:

causing the ring oscillator to oscillate;

receiving a halt control signal to halt the oscillation of the ring oscillator;

latching a value at each output in one of a plurality of N latches to create a latched value R;

converting the latched value of R to a binary number;

counting a number of complete cycles of the ring oscillator to produce a count C; and presetting a value of C and wherein the counting comprises counting from the preset value.

29. A method of capturing the state of a ring oscillator, the ring oscillator comprising a plurality of N logic gates, each gate having an input and an output, the gates being connected together input to output to form a continuous loop, comprising:

causing the ring oscillator to oscillate;

receiving a halt control signal to halt the oscillation of the ring oscillator;

latching a value at each output in one of a plurality of N latches to create a latched value R;

converting the latched value of R to a binary number;

counting a number of complete cycles of the ring oscillator to produce a count C: and combining the values of C and R to produce a number of gate transitions.

30. The method of claim 29, wherein the counting is carried out in a ripple counter circuit.

31. A method of capturing the state of a ring oscillator, the ring oscillator comprising a plurality of N logic gates, each gate having an input and an output, the gates being connected together input to output to form a continuous loop, comprising:

causing the ring oscillator to oscillate;

receiving a halt control signal to halt the oscillation of the ring oscillator;

latching a value at each output in one of a plurality of N latches to create a latched value R;

converting the latched value of R to a binary number;

counting a number of complete cycles of the ring oscillator to produce a count C; and presetting a value of C and wherein the counting comprises counting from the preset value.

32. The method of claim 28, wherein the counting is carried out in a ripple counter circuit.

33. The method of claim 31, wherein the counting is carried out in a ripple counter circuit.

* * * * *